(12) United States Patent  (10) Patent No.: US 7,869,778 B2
Cavin                    (45) Date of Patent: *Jan. 11, 2011

(54) MASTER-SLAVE LOCAL OSCILLATOR PORTING BETWEEN RADIO INTEGRATED CIRCUITS

(75) Inventor: Mark S. Cavin, St. Leonard, MD (US)

(73) Assignee: IPR Licensing, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/396,049

(22) Filed: Mar. 2, 2009

(65) Prior Publication Data

US 2009/0170448 A1   Jul. 2, 2009

Related U.S. Application Data

(63) Continuation of application No. 10/707,312, filed on Dec. 4, 2003, now Pat. No. 7,499,684.

(60) Provisional application No. 60/481,399, filed on Sep. 19, 2003.

(51) Int. Cl.
H04B 7/12   (2006.01)

(52) U.S. Cl. .................. 455/141; 455/146; 455/147; 455/84; 455/426.2

(58) Field of Classification Search .......... 455/141, 455/146, 147, 84, 426.2, 86, 196.1, 208, 455/315
See application file for complete search history.

(56) References Cited

U.S. PATENT DOCUMENTS

| | | | | |
|---|---|---|---|---|
| 3,673,505 A | * | 6/1972 | Limberg | 329/362 |
| 4,025,874 A | | 5/1977 | Abbey | |
| 4,131,861 A | | 12/1978 | Malaviya | |
| 4,264,867 A | * | 4/1981 | Ishii | 329/342 |
| 4,521,745 A | | 6/1985 | Falconer | |
| 5,297,223 A | * | 3/1994 | van Deventer | 385/11 |
| 5,394,559 A | * | 2/1995 | Hemmie et al. | 725/73 |
| 5,610,558 A | | 3/1997 | Mittel et al. | |
| 5,666,388 A | | 9/1997 | Neron | |
| 5,669,068 A | * | 9/1997 | Kielmeyer et al. | 455/83 |
| 5,734,301 A | | 3/1998 | Lee et al. | |
| 5,808,285 A | * | 9/1998 | Rockstein et al. | 235/472.02 |
| 5,828,660 A | * | 10/1998 | Baum et al. | 370/330 |
| 5,856,766 A | | 1/1999 | Gillig et al. | |
| 6,043,715 A | | 3/2000 | Bailey et al. | |
| 6,069,583 A | * | 5/2000 | Silvestrin et al. | 342/357.01 |
| 6,115,584 A | * | 9/2000 | Tait et al. | 455/73 |
| 6,188,286 B1 | | 2/2001 | Hogl et al. | |
| 6,194,969 B1 | | 2/2001 | Doblar | |
| 6,297,702 B1 | | 10/2001 | Locker et al. | |

(Continued)

*Primary Examiner*—Minh D Dao
(74) *Attorney, Agent, or Firm*—Volpe and Koenig, P.C.

(57) ABSTRACT

A technique to share a local oscillator signal between two radio frequency integrated circuits (RFICs). The local oscillator signal generated internally by one RFIC is ported to the other RFIC for use in transmit or receive operation. The local oscillator signal that is ported may be an RF local oscillator signal. Each RFIC may include a bi-directional port circuit that can be operated to make the RFIC a master, slave or may be totally disabled to disable the porting feature. This is particularly useful in RFICs that are used to communicate using MIMO radio algorithms which rely for optimum performance on phase and frequency coherency among a plurality of transmitters and a plurality of receivers.

22 Claims, 5 Drawing Sheets

U.S. PATENT DOCUMENTS

| | | | |
|---|---|---|---|
| 6,363,129 | B1 | 3/2002 | Agazzi |
| 6,538,516 | B2 | 3/2003 | Lenk |
| 6,552,578 | B1 | 4/2003 | Cheung |
| 6,560,299 | B1 | 5/2003 | Strolle et al. |
| 6,587,450 | B1 * | 7/2003 | Pasanen ................ 370/338 |
| 6,687,493 | B1 * | 2/2004 | Sorrells et al. .......... 455/323 |
| 6,728,517 | B2 * | 4/2004 | Sugar et al. ............. 455/73 |
| 6,735,426 | B1 * | 5/2004 | Pau ........................ 455/255 |
| 2002/0191535 | A1 * | 12/2002 | Sugiyama et al. ........... 370/208 |
| 2003/0203743 | A1 * | 10/2003 | Sugar et al. ............ 455/550.1 |
| 2004/0121753 | A1 * | 6/2004 | Sugar et al. ............. 455/333 |
| 2004/0151257 | A1 * | 8/2004 | Staszewski et al. ........ 375/296 |
| 2005/0064892 | A1 * | 3/2005 | Cavin .................... 455/550.1 |
| 2005/0163252 | A1 * | 7/2005 | McCallister et al. ........ 375/296 |
| 2006/0089114 | A1 * | 4/2006 | Maxim et al. ............ 455/179.1 |
| 2006/0205374 | A1 * | 9/2006 | Darabi et al. ............. 455/259 |

* cited by examiner

MASTER-SLAVE LOCAL OSCILLATOR PORTING BETWEEN RADIO INTEGRATED CIRCUITS

CROSS REFERENCE TO RELATED APPLICATIONS

This application is a continuation of U.S. application Ser. No. 10/707,312, filed Dec. 4, 2003, which issued on Mar. 3, 2009 as U.S. Pat. No. 7,499,684, which claims the benefit of U.S. Provisional Application Ser. No. 60/481,399, filed Sep. 19, 2003, which are incorporated herein by reference as if fully set forth.

FIELD OF INVENTION

This application is related to radio communications.

BACKGROUND

The present invention relates to radio transceiver circuit technology, and more particularly to a technique to eliminate local oscillator signal phase drift between two radio transceiver integrated circuits.

A fully integrated multiple-input multiple-output (MIMO) radio frequency transceiver has been developed and is disclosed in commonly assigned co-pending U.S. application Ser. No. 10/065,388, filed Oct. 11, 2002, entitled "Multiple-Input Multiple-Output Radio Transceiver," the entirety of which is incorporated herein by reference. This MIMO radio frequency integrated circuit (MIMO RFIC) may include two or more transmitters and two or more receivers in the same IC to simultaneously transmit multiple signals and/or to simultaneously receive multiple signals.

One application of the MIMO RFIC is in communicating between two devices using a MIMO radio algorithm. Examples of MIMO radio algorithms are disclosed in commonly assigned and co-pending U.S. patent application Ser. No. 10/174,689, filed Jun. 19, 2002, and entitled "System and Method for Antenna Diversity Using Equal Power Joint Maximal Ratio Combining;" U.S. patent application Ser. No. 10/174,728, filed Jun. 19, 2002, and entitled "System and Method for Antenna Diversity Using Joint Maximal Ratio Combining," and U.S. patent application Ser. No. 10/064,082, filed Jul. 18, 2002 and entitled "System and Method for Joint Maximal Ratio Combining Using Time-Domain Based Signal Processing," the entirety of all of which are incorporated herein by reference. For optimal performance of these MIMO radio algorithms, the individual transmitters and receivers should be phase-coherent in each RFIC. Consequently, the local oscillator signal used to drive each transmitter and each receiver in each RFIC must be phase coherent (same phase). This is a manageable problem internal to the RFIC since each transmitter and each receiver are driven by the same local oscillator signal.

When it is desired to exploit the benefits of the MIMO radio algorithms by increasing the number of antenna paths to, for example, four (4) at a device, two MIMO RFICs each having two transmitters and two receivers may be used cooperatively with a common baseband signal processor. In this configuration, phase coherency of the combined transmitters and combined receivers must be achieved across two separate RFICs in order to achieve the maximum performance benefits of certain MIMO radio algorithms. No techniques to solve this problem are heretofore known.

Each MIMO RFIC will have its own frequency synthesizer to generate local oscillator signals. Due to static phase error variations between the synthesizers of both radios, the relative phase between the two radio paths will drift with the variation in the static phase errors of the two synthesizers. This static phase error variation can be due to propagation delay and/or leakage current variation due to temperature gradients. In addition, the synthesizers in each RFIC could have different low frequency offset noise characteristics, resulting in different low frequency wander.

Accordingly, a technique is needed to achieve phase as well as frequency coherency between two RFICs that are used in a cooperative manner, such as with a common baseband signal processor.

SUMMARY

A technique is provided to share a local oscillator signal between two radio frequency integrated circuits (RFICs). The local oscillator signal generated internally by one RFIC is ported to (and shared with) the other RFIC for use in transmit or receive operation. The local oscillator signal that is ported may be an RF local oscillator signal. Each RFIC includes a bi-directional port circuit that can be operated to make the RFIC a master, a slave or may be totally disabled when the porting feature is not needed. This is particularly useful in RFICs that are used to communicate using multiple-input multiple-output (MIMO) radio algorithms which rely for optimum performance on phase and frequency coherency among a plurality of transmitters and a plurality of receivers. The circuitry is configured to transmit a signal at the determined transmit power level.

DETAILED DESCRIPTION

Figure 1:
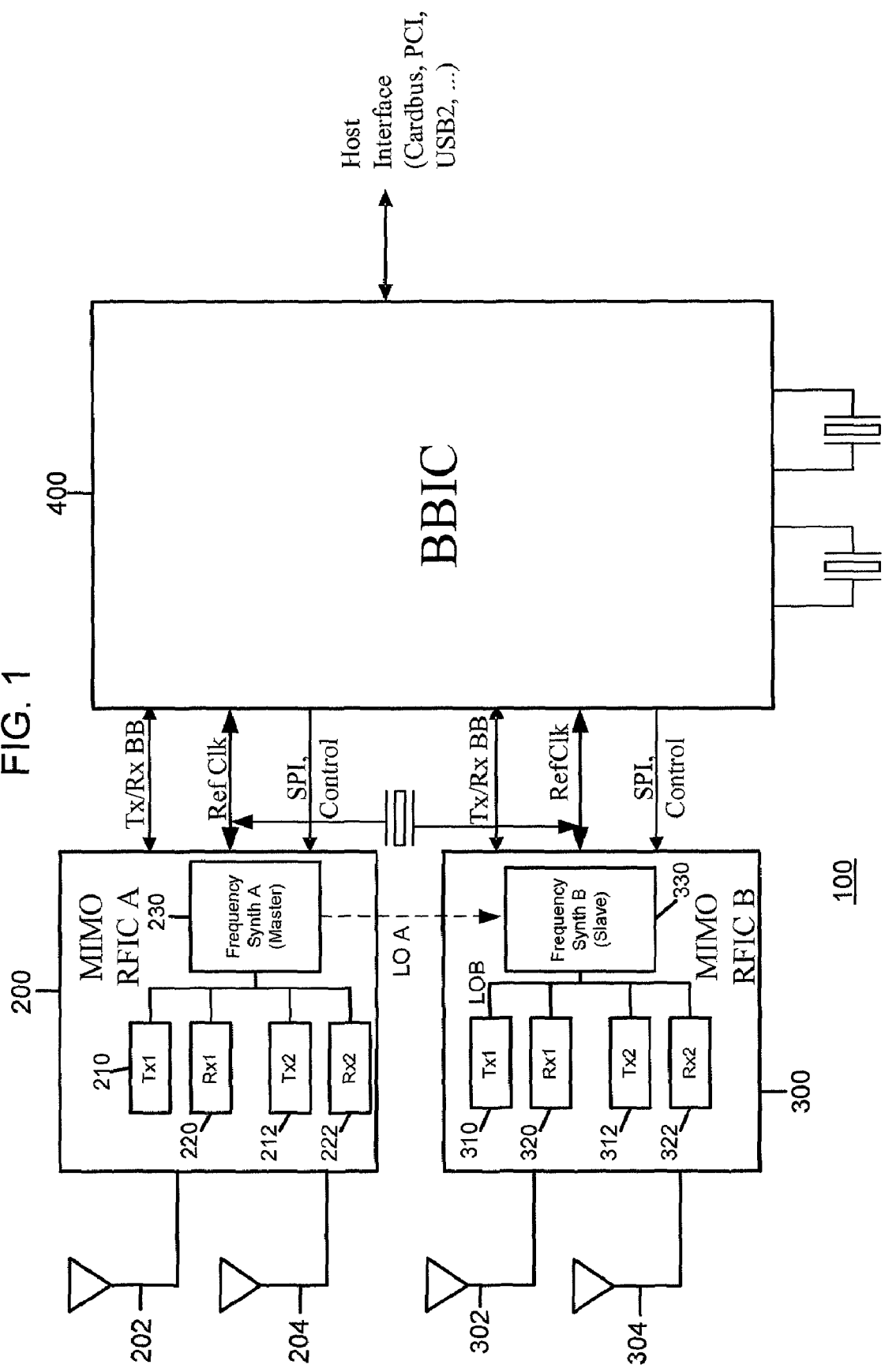
FIG. 1 is a block diagram of a radio communication device having two MIMO RFICs coupled to a baseband processing circuit.

FIG. 1 shows a block diagram of a radio communication device 100 capable of 4 antenna path (4x) MIMO radio communication. One way to provide 4x capability is to deploy two MIMO radio integrated circuits (ICs), each having two transmitters and two receivers, for cooperative use by a baseband signal processor or integrated circuit (BBIC). An example of a fully integrated MIMO radio frequency IC (MIMO RFIC) is disclosed in aforementioned U.S. application Ser. No. 10/065,388, filed Oct. 11, 2002. In general, each RFIC may have N transmitters and N receivers.

There are two MIMO RFICs 200 and 300 shown in FIG. 1, RFIC 200 designated RFIC A and RFIC 300 designated RFIC B. Each RFIC 200 and 300 has at least two radio transmitters (Tx's) and two radio receivers (Rx's), connected to operate with a corresponding one of the two antennas. Specifically, RFIC 200 has Tx1 210, Tx2 212, Rx1 220 and Rx2 222, and RFIC 300 has Tx1 310, Tx2 312, Rx1 320 and Rx2 322. In RFIC 200, Tx1 210 and Rx1 220 couple to a first antenna 202, and Tx2 212 and Rx2 222 couple to a second antenna 204. Similarly, in RFIC 300, Tx1 310 and Rx1 320 couple to an antenna 302 and Tx2 312 and Rx 322 couple to an antenna 304. RFIC 200 has a frequency synthesizer (synth) 230 designated A and RFIC 300 has a frequency synthesizer 330 designated B. Frequency synthesizer 230 supplies the same local oscillator signal to the mixers in the transmitters Tx1 and Tx2 when transmitting, and the same local oscillator signal to the mixers in the receivers Rx1 and Rx2 when receiving. Likewise, in RFIC 300, frequency synthesizer 330 would do the same for its transmitters and receivers. However, when two MIMO RFICs are used together to increase the number of antenna paths, all four transmitters (Tx1 210 and Tx2 212 in RFIC 200 and Tx1 310 and Tx2 312 in RFIC 300) need to be driven with a common local oscillator (LO) signal (at the same frequency and phase across all transmitters) to ensure optimum operation of certain MIMO radio algorithms (executed at baseband by the BBIC 400). The same is true when receiving, where all four receivers (Rx1 220 and Rx2 222 in RFIC 200 and Rx1 320 and Rx2 322 in RFIC 300) need to be driven by a local oscillator signal at the same frequency and phase across all receivers.

A mechanism is provided to achieve phase alignment between the local oscillator signal used in one RFIC with the local oscillator signal in the other RFIC by porting the local oscillator signal (or a signal representative or derived therefrom) generated in one RFIC to the other RFIC. This is shown pictorially in FIG. 1, where RFIC 200 is designated as the master and generates a local oscillator signal (LO A) that is ported to RFIC 300, that is designated the slave. RFIC 300 uses the ported local oscillator signal (LO A) as the local oscillator signal (LO B) that is coupled to the mixers in the Tx1 310 and Tx2 312 for transmit operation or to Rx1 320 and Rx2 322 for receive operation. In essence, RFIC 200 and RFIC 300 each use the same RFLO signal (LO A) for simultaneously transmitting signals at the same radio frequency corresponding to the frequency of the signal LO A or for simultaneously receiving signals at the same radio frequency corresponding to the frequency of the signal LO A.

Figure 2:
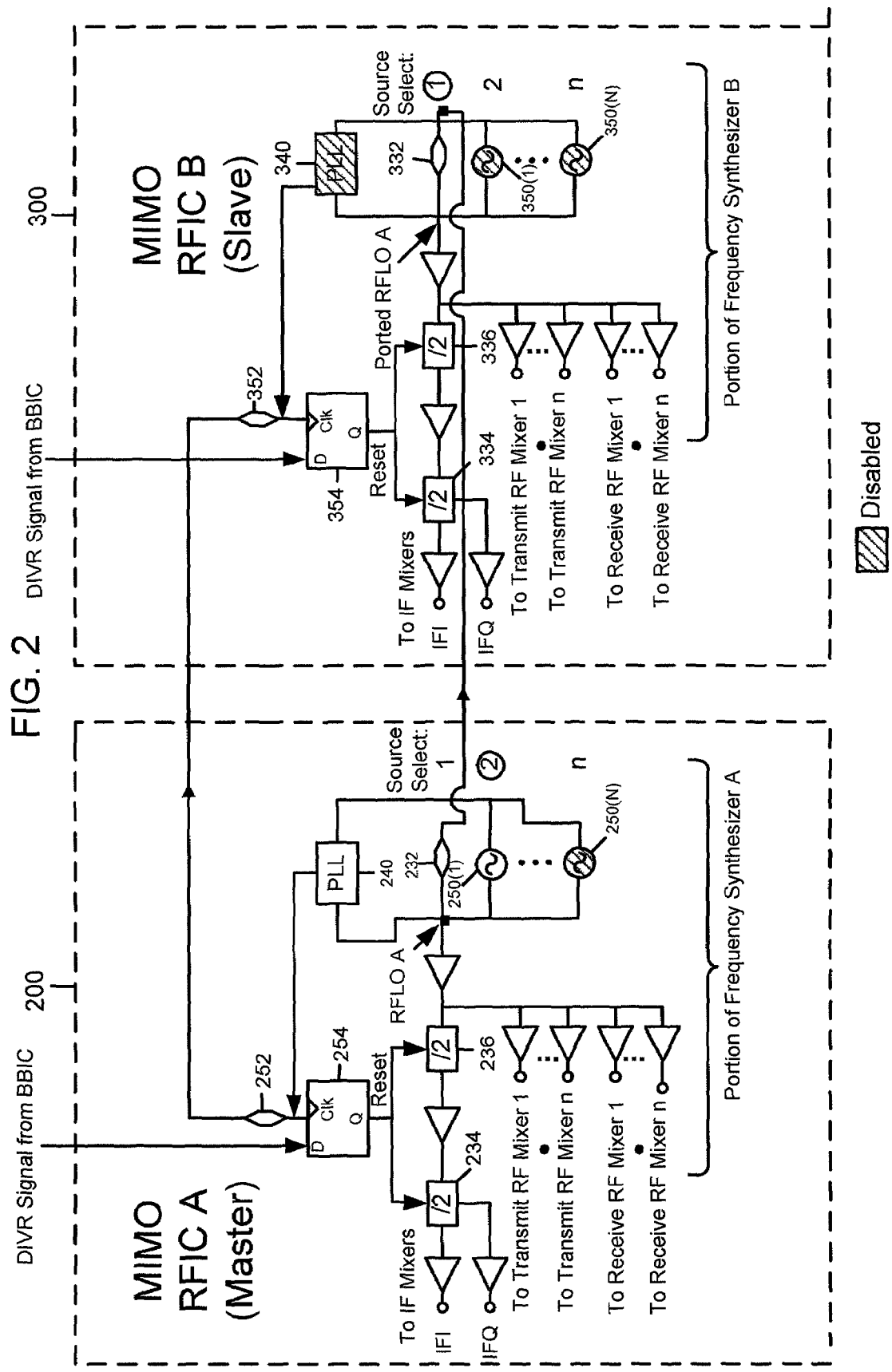
FIGS. 2 and 3 are more detailed block diagrams showing two configurations for porting local oscillator signals from one RFIC to another RFIC.
Figure 3:
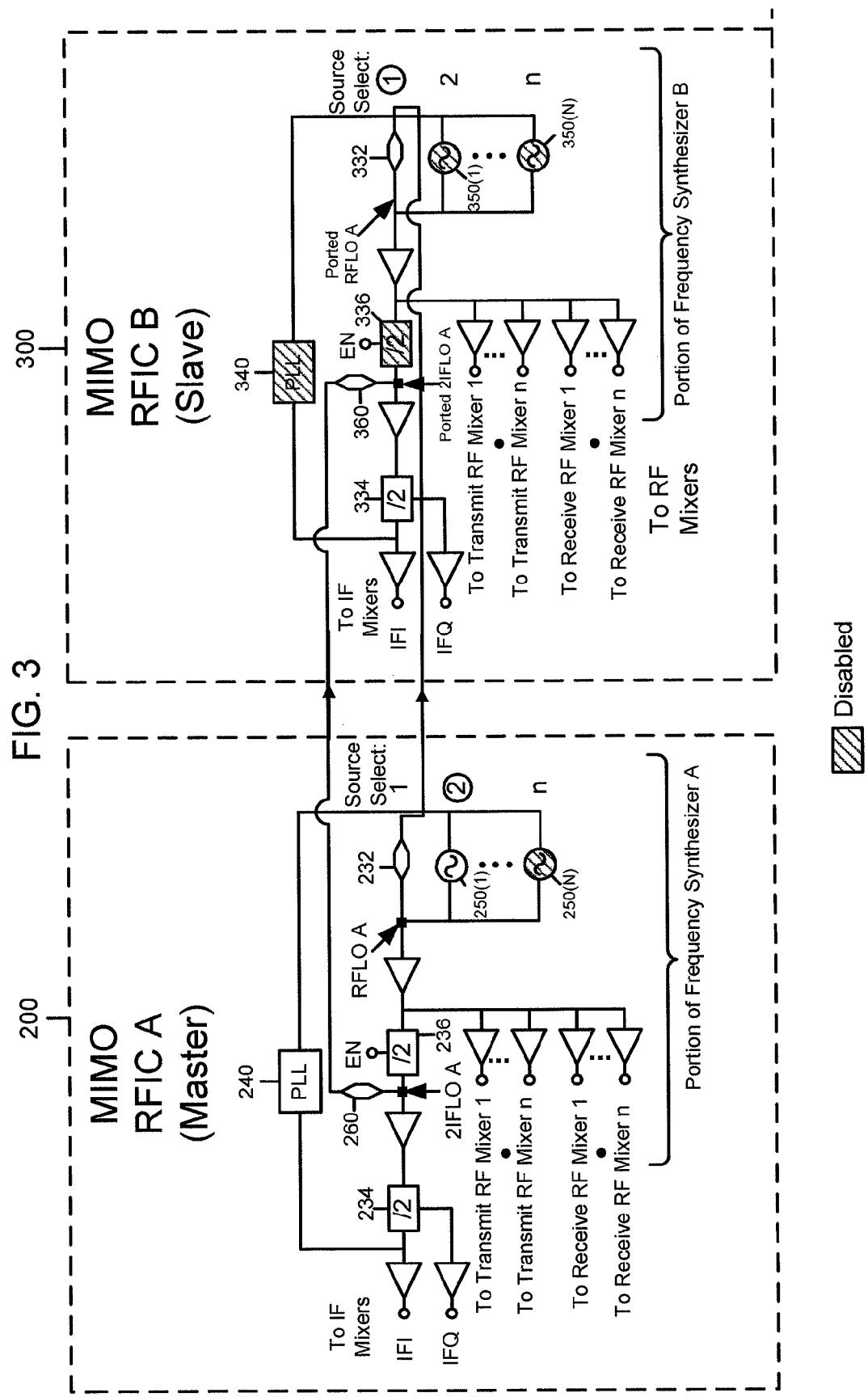

FIGS. 2 and 3 illustrate examples of ways to port a local oscillator signal from one RFIC to the other. The local oscillator signal source may be fixed, or it may be variable (synthesized) within one or more frequency bands. The diagrams show portions of frequency synthesizer 230 of RFIC 200 and frequency synthesizer 330 of RFIC 300, and the frequency synthesizers are, in this example, based on a superheterodyne architecture that derives (by a divide-by-4 process) the intermediate frequency (IF) LO from the RFLO. In FIG. 2, in each RFIC, there are two divide-by-2 circuits (shown as "/2" in the figures) that are outside of a phase locked loop (PLL) and in FIG. 3, the divide-by-2 circuits are inside the PLL. Furthermore, in both figures, there may be a plurality of local oscillators each connected to a respective one of positions 2, ..., n in each frequency synthesizer to generate local oscillator signals for multiple frequency bands (e.g., 2.4 GHz unlicensed band and the 5 GHz unlicensed bands). Moreover, these local oscillators may operate with a multi-modulus divider (not shown in FIGS. 2 and 3) as part of a fractional-N frequency synthesizer system to generate LO signals for particular channels within each band.

A bi-directional port circuit is connected to position 1 in each frequency synthesizer for the purposes explained hereinafter. The bi-directional port circuit is described further hereinafter in conjunction with FIG. 4. Source select is made by enabling or disabling the appropriate local oscillator and certain components in the bi-directional port as described hereinafter. It should be understood that the PLLs shown in FIGS. 2 and 3 are simplified into one block and the connections to that block. Those with ordinary skill in the art will understand that the PLL is a subsystem that includes components such as a phase detector, charge pump, low pass filter, voltage controlled oscillator, etc. When a component is said to be "inside the PLL," this means that the component is connected to other components inside a loop formed by interconnections of the PLL components. When a component is said to be "outside the PLL," this means that the component is outside the loop formed by the interconnections of the PLL components. FIG. 5 illustrates a configuration where the divide-by-2 circuits are inside the PLL frequency synthesizer system.

With specific reference to FIG. 2, RFIC 200 comprises an RFLO bi-directional port 232, a first divide-by-2 circuit 234, a second divide-by-2 circuit 236, a PLL 240 and one or more oscillators 250(1) to 250(N). The RFLO bi-directional port 232 is coupled to the source select position 1. RFIC 200 generates an RFLO A signal that in RF IC 200 is coupled to either the transmit RF mixers in the transmitters, or to the receive RF mixers in the receivers. It is also coupled to the divide-by-2 circuits 236 and 234 which generate the IF mixer signal (or signals in the case of I and Q) that are coupled to the respective IF mixers in the transmitters or in the mixers of RFIC 200. Alternatively, the RFLO used by RFIC 200 may be sourced from the RFIC 300 (where RFIC 300 is the master and RFIC 200 is the slave.) RFIC 200 also has a divider reset signal (DIVR) synchronization bi-directional port 252 the purpose of which is explained hereinafter.

Similarly, RFIC 300 comprises an RFLO bi-directional port 332, a first divide-by-2 circuit 334, a second divide-by-2 circuit 336, a PLL 340 and one or more oscillator 350(1) to 350(N). The RFLO bi-directional port 332 is coupled to the source select position 1. The RFLO signal, either generated by RFIC 300, or ported from RFIC 200, is coupled in RFIC 300 to either the transmit RF mixers in the transmitters, or to the receive RF mixers in the receivers. It is also coupled to the divide-by-2 circuits 336 and 334 which generate the IF mixer signal (or signals in the case of I and Q) that are coupled to the respective IF mixers in the transmitters or in the mixers of RFIC 300. RFIC 300 has a DIVR bi-directional synchronization port 352 whose purpose is explained below.

As shown in FIG. 2, there is an inter-chip electrical connection between a package pin associated with the RFLO bi-directional port 232 in RFIC 200 and a package pin associated with the RFLO bi-directional port 332 in RFIC 300. There is also an inter-chip connection between a package pin associated with the DIVR bi-directional synchronization port 252 of RFIC 200 and package pin associated with the DIVR bi-directional synchronization port 352 of RFIC 300. This inter-chip connection may be, for example, a conductive trace on a circuit board on which the RFICs 200 and 300 are mounted.

The operation of the configuration shown in FIG. 2 will now be described. As mentioned above, either RFIC can be the master or the slave. For purposes of explanation, the RFIC 200 is designated the master and the RFIC 300 is the slave. Specifically, with RFIC 200 being the master, then RFLO A generated by the frequency synthesizer of RFIC 200 is coupled to: (1) the mixers in the transmitters or mixers in the receivers of RFIC 200 and to the divide-by-2 circuits 236 and 234 to generate the IFLO I and Q signals for RFIC 200, and (2) the RFLO bi-directional port 232 in RFIC 200 that is connected externally from RFIC 200 to the RFLO bi-directional port 332 of RFIC 300 so that RFLO A is ultimately supplied to the mixers in the transmitters or mixers in the receivers of RFIC 300 and to the divide-by-2 circuits to generate the IFLO I and Q signals for RFIC 300. Consequently, the RFLO used in RFIC 200 will be the same as the RFLO used in RFIC 300, avoiding any phase drifts between the resulting signals output by RFIC 200 and RFIC 300. There will be a constant static phase error due to the path length/propagation delay between the master LO port and the slave LO port. However, problematic drifts between RFIC 200 and RFIC 300 are reduced. In this example, the oscillator source selected in RFIC 200 may be any one of the sources 2 to N corresponding to oscillators 250(1) to 250(N), respectively. Oscillator 250(1) at position 2 is selected as an example and the other oscillators would be disabled. In RFIC 300 the PLL 340 and all local oscillators 350(1) to 350(N) are disabled so that source 1 is selected which is connected to the RFLO bi-directional port 332 that couples the signal supplied to it to the components of the frequency synthesizer in RFIC 300.

Again with reference to FIG. 2, the synchronization of the divider reset between RFICs is described. The purpose of the DIVR signal is to reset the divide-by-2 circuits in the RFICs. The BBIC 400 generates the DIVR signal and it is coupled to each the RFICs by a serial interface, for example. Reset synchronization of the divide-by-2 circuits in RFIC 200 and RFIC 300 is achieved by porting from RFIC 200 to RFIC 300 a clock signal that latches the DIVR signal to the divide-by-2 circuits. To this end, RFIC 200 has a flip-flop (FF) or latch circuit 254 that receives at a D input the DIVR signal from the BBIC, a clock (Clk) input and a Q output. The Q output is the latched DIVR signal coupled to the divide-by-2 circuits. Similarly, RFIC 300 has a FF 354 that has a D input and a Clk input and Q output. In RFIC 200, a clock signal is supplied to the FF 254 from the PLL 240 (such as from a multi-modulus divider in the PLL 240) and this clock signal latches the DIVR signal from the BBIC 400 to the divide-by-2 circuits 234 and 236. Similarly, in RFIC 300, a clock signal is supplied to the FF 354 from the PLL 340. When RFIC 200 is the master, the port 252 couples clock signal from the PLL 240 to the port 352 in RFIC 300. When RFIC 300 is the slave, the PLL 340 in RFIC 300 is disabled so the clock signal from RFIC 200 that is coupled to port 352 is connected to the clock input of FF 354. In this manner, reset of the divide-by-2 circuits in RFIC 200 and RFIC 300 are synchronized to the same clock signal.

When an RFLO signal is ported from one MIMO RFIC to another MIMO RFIC, in transmit mode, the multiple transmitters in each RFIC simultaneously transmit signals (a combined plurality of transmit signals) on a frequency corresponding to the frequency of the ported RFLO signal. In so doing, RFIC 200 supplies the signal LO A (and IF signal derived therefrom) for use by its plurality of transmitters. Likewise, RFIC 300 supplies the LO signal (and IF signal derived therefrom) that is ported from RFIC 200 to its plurality of transmitters. The BBIC 400 supplies a plurality of baseband transmit signals to each RFIC according to the type of MIMO radio algorithm employed. Specifically, the BBIC 400 generates a plurality of baseband transmit signals consisting of a first plurality of baseband transmit signals for transmission by RFIC 200 and a second plurality of baseband transmit signals for transmission by RFIC 300.

Likewise, in receive mode, the multiple receivers in each RFIC simultaneously receive signals (a combined plurality of receive signals) on a frequency corresponding to the frequency of the ported RFLO signal. The BBIC 400 processes the plurality of receive signals according to the type of MIMO radio algorithm employed. RFIC 200 supplies the signal LO A to each of its plurality of receivers and RFIC 300 supplies the signal LO A to each of its receivers. RFIC 200 receives a first plurality of receive signals and produces a corresponding first plurality of receive baseband signals and simultaneously RFIC 300 receives a second plurality of receive signals and produces a corresponding second plurality of receive baseband signals. The BBIC 400 processes the first plurality of baseband receive signals from RFIC 200 and the second plurality of baseband receive signals from RFIC 300.

Turning to FIG. 3, another master-slave configuration is shown that is similar to FIG. 2, but the divide-by-2 circuits 234 and 236 are inside the PLL 240 rather than outside the PLL as shown in FIG. 2. Similarly, in RFIC 300, the divide-by-2 circuits 334 and 336 are inside the PLL 340. In this case, the RFLO A signal from RFIC 200 is ported via RFLO bi-directional port 232 to RFLO bi-directional port 332 of RFIC 300 in the same manner as shown in FIG. 2. In addition, an intermediate frequency LO signal from RFIC A 200 is ported to RFIC 300. Specifically, the signal 2IFLO A (a signal twice the frequency of the desired intermediate frequency local oscillator signal) at the output of the first divide-by-2 circuit 236 in RFIC 200 is coupled by a 2IFLO bi-directional port 260 to a 2IFLO bi-directional port 360 in RFIC 300. In this manner, both the RFLO A and 2IFLO A signals are ported to RFIC 300. Accordingly, in this configuration, the slave RFIC disables its PLL, first divide-by-2 circuit, and all local oscillators. Consequently, the configuration of FIG. 3 does not require synchronizing the DIVR signal.

Figure 4:
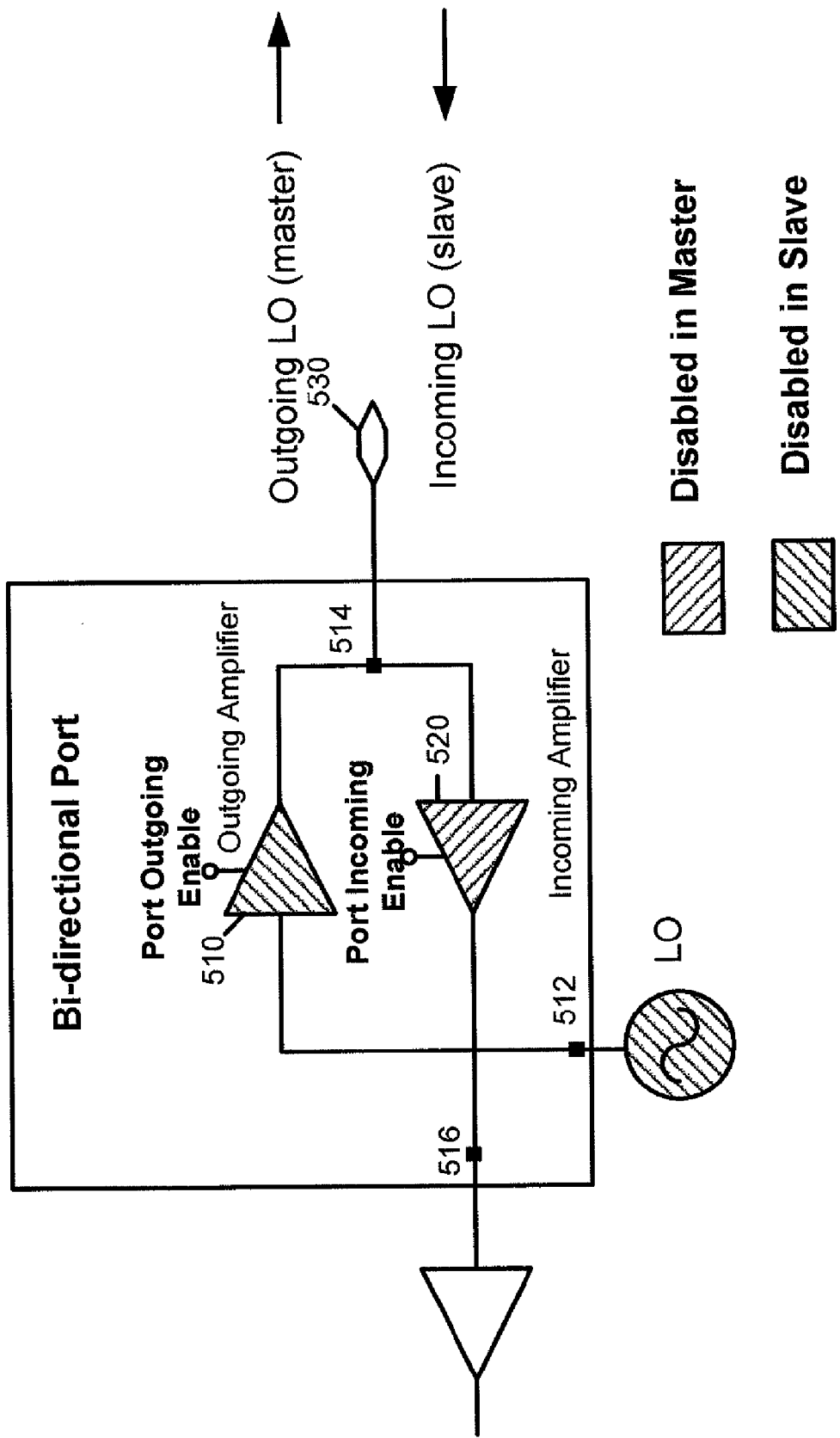
FIG. 4 is a block diagram of a bi-directional port that is used in the system configurations shown in FIGS. 2 and 3.
Figure 5:
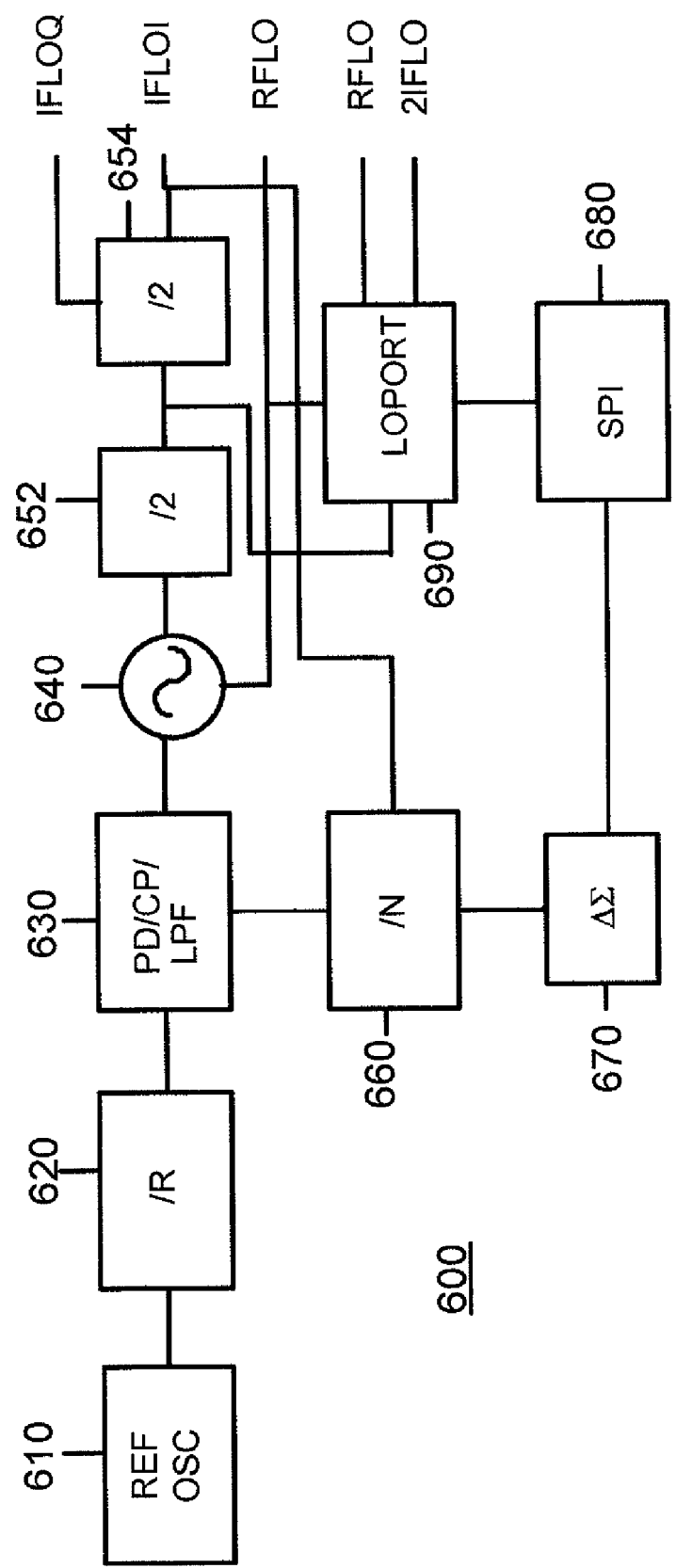
FIG. 5 is a block diagram of a frequency synthesizer having the divide-by-4 function incorporated inside a phase lock loop as shown in FIG. 3.

FIG. 4 shows in more detail the bi-directional port circuit referred to in FIGS. 2 and 3. The bi-directional port circuit (corresponding to reference numeral 232, 252, 260, 332, 352, 360 in FIGS. 2 and 3) comprises an outgoing amplifier 510 and an incoming amplifier 520. An input of the outgoing amplifier 510 is connected between a first terminal 512 that connects to signal source (e.g., frequency synthesizer or DIVR signal) and an output of the amplifier 510 connects to a second terminal 514 that connects to the package pin 530. An input of the incoming amplifier 520 is connected to the second terminal 514 and an output of the incoming amplifier 520 is connected to a third terminal 516 that connects to the point in the frequency synthesizer that is connected to the transmitters or receivers and to a divide-by-2 circuit.

The circuitry used to implement the amplifiers 510 and 520 shown in FIG. 4 may be any known amplifier circuitry. For example, the amplifiers may be designed in such a way as to not degrade or load the other amplifier when disabled. Each amplifier is capable of driving the package and board load between the master and slave RFIC. In addition, for applications at LO frequencies, a shared termination resistance may be incorporated to optimize impedance matching and minimize reflections between the RFIC and the package/printed circuit board. Differential circuits may be utilized for optimal common mode noise rejection. For the purposes of illustration only, signals are represented as single-ended.

In the master radio, the outgoing amplifier 520 is enabled by the port outgoing enable signal to amplify the signal to be ported, e.g., an LO signal, which is output by the (external) package pin 530 to the package pin of the bi-directional port of the slave radio. The incoming amplifier 520 is disabled in the master radio. By contrast, in the bi-directional port used in a slave radio, the incoming amplifier 520 is enabled by the port incoming enable signal and the outgoing amplifier 510 is disabled, so that the incoming amplifier amplifies the ported LO signal from the master radio, and couples the amplified LO signal to its frequency synthesizer system. As explained above, each RFIC will have a bi-directional port where indicated in FIGS. 2 and 3 so that an RFIC so equipped can serve as a master or a slave for the various ported signals referred to above in connection with FIGS. 2 and 3. The package pin 530 of the bi-directional port is bi-directional as well. For each bi-directional port in an RFIC, there is a corresponding bi-directional package pin 530. That is, the package pin associated with a port circuit in each RFIC is used for coupling a signal to or from the other RFIC. However, the port circuit may be used with separate outgoing and incoming package pins, if desired.

The bi-directional port circuit shown in FIG. 4 can be used to port the RFLO signal, 2IFLO signal and DIVR signal. Thus, in the configuration for FIGS. 2 and 3, each RFIC would have two bi-directional ports, each having a corresponding dedicated bi-directional package pin. In FIG. 2, the bi-directional ports are used for the RFLO signal and the synchronization of the DIVR signal, while in FIG. 3, the bi-directional ports are used for the RFLO signal and the 2IFLO signal. To completely disable the porting function of the bi-directional port, both the incoming amplifier and the outgoing amplifier are disabled. In other words, the enable signals are not coupled to the internal amplifiers of the bi-directional port. The bi-directional nature of the port enables any RFIC that includes it to operate as a master or a slave. Therefore, a common RFIC design can be manufactured and when incorporated for use in a device, it can serve as a master RFIC, slave RFIC, or can be operated stand-alone with its own PLL frequency synthesizer. No unique circuitry is required to make an RFIC function as a master that is any different from what is required to make it function as a slave.

While the port circuit has been described in the foregoing as primarily being bi-directional, it need not be. For example, in the event it is desired to make a RFIC be capable of functioning solely as a master for the porting function, then the port circuit may comprise only an outgoing amplifier. Conversely, an RFIC may be configured to be capable of functioning solely as a slave for the porting function and in such a case the port circuit may comprise only an incoming amplifier. In these forms of the port circuit, it, when enabled, functions only in one direction.

FIG. 5 illustrates a frequency synthesizer system 600 with the divide-by-2 circuits located inside the PLL. This is the type of frequency synthesizer system useful in the master-slave configuration shown in FIG. 3. The system 600 comprises a reference oscillator 610, a reference (/R) divider 620, a phase detector/charge pump/lowpass filter (PD/CP/LPF) block 630, a voltage controlled oscillator (VCO) 640, divide-by-2 circuits 652 and 654, a multi-modulus (/N) divider 660, a delta-sigma block 670 and a serial-to-parallel interface (SPI) 680. The PD/CP/LPF block 630 may be implemented as separate blocks or circuits connected in series. For example, there may be a separate PD circuit having an output connected to an input of the CP circuit. An output of the CP circuit is connected to an input of the LPF circuit, and finally an output of the LPF circuit is connected to an input of the VCO 640. The first and second divide-by-2 circuits 652 and 654, respectively, are connected inside the PLL formed by the connections between the VCO 640, multi-modulus divider 660 and the PD/CP/LPF block 630. The RFLO signal is taken from the VCO 640 and is used for output, and is also coupled to a bi-directional LO port 690. The IFLO signal output by the second divide-by-2 circuit 654 is coupled to an input of the multi-modulus divider 660. The 2IFLO signal is coupled to the LO port 690. An output of the multi-modulus divider 660 is coupled to an input of the PD. Ignoring for simplicity the CP and LPF functions, an output of the PD function is coupled (after the CP and LPF functions) to an input of the VCO 640. An output of the VCO is coupled to an input of the first divide-by-2 circuit 652. An advantage of incorporating the divide-by-4 function inside the PLL is that it forces the IFLO to be locked to the reference and therefore eliminates phase ambiguity in the master RFIC. The RFLO and 2IFLO signals may be ported to another RFIC via the bi-directional port 690. Bi-directional port 690 is similar to the one shown in FIG. 4, but comprises duplicates of the internal components to port two signals simultaneously and independently. By porting the RFLO and the 2IFLO signals from the master to the slave, the 90 degree phase ambiguity in the slave RFIC is eliminated, and consequently there is no need for generating and synchronizing a DIVR signal.

While the foregoing description has been made with respect to radios that employ a superheterodyne architecture, it should be understood that it is equally applicable to a direct conversion architecture in which case only the RFLO signal would need to be ported from the master radio to the slave radio.

To summarize, a radio communication device is provided comprising a first radio integrated circuit (IC) that performs one or both of radio transmission or radio reception; a second radio IC that performs one or both of radio transmission or radio reception; and wherein the first radio IC generates and uses a local oscillator signal for radio transmission and/or radio reception operation, and wherein the local oscillator signal is coupled to the second radio IC for use in its radio transmission and/or radio reception operation. Each of the first and second radio ICs each comprises a port circuit. The port circuit in the first radio IC couples the local oscillator signal to the port circuit of the second radio IC, and the port circuit in the second radio IC couples the local oscillator signal from the first radio IC for use by its radio transmitter or radio receiver.

In addition, a radio device is provided comprising at least one of a radio transmitter to transmit a signal or a radio receiver to receive a signal; a local oscillator signal source that provides a local oscillator signal that is coupled to the radio transmitter or radio receiver for use thereby; a port circuit coupled to the local oscillator signal source that either (1) couples the local oscillator signal to an external pin for connection to another radio device or (2) couples an externally generated local oscillator signal supplied at the external pin for use by the radio transmitter or radio receiver (instead of the internally generated local oscillator signal). The radio device, including the transmitter and/or radio receiver, local oscillator and port circuit may be implemented on a single integrated circuit. The radio device may include a port circuit that, when enabled (acting as a master), is capable of only coupling an internally generated local oscillator signal to another radio device, or conversely, capable of only coupling an externally generated local oscillator signal to the transmitter or receiver of the radio device (acting as a slave).

A port circuit is provided comprising a first terminal and a second terminal, the first terminal for connection to a signal source and the second terminal for connection to an external pin of an integrated circuit radio device; a first amplifier connected between the first terminal and the second terminal to amplify a signal supplied at the first terminal for output to the second terminal; a second amplifier connected between the first terminal and the second terminal to amplify a signal supplied at the external pin; wherein the first amplifier is disabled when the second amplifier is enabled and the second amplifier is disabled when the first amplifier is enabled.

A method is provided for achieving phase and frequency coherency between first and second radio integrated circuits (ICs), comprising steps of: in the first radio IC, generating a local oscillator signal for use by at least one receiver or at least one transmitter in the first radio IC; electrically coupling the local oscillator signal from the first radio IC to the second radio IC; in the second radio IC, coupling the local oscillator signal to at least one receiver or at least one transmitter for operation, thereby ensuring that the at least one receiver in the first radio IC and the at least one receiver in the second radio IC will simultaneously operate with phase and frequency coherency from the local oscillator signal, and the at least one transmitter in the first radio IC and the at least one transmitter in the second radio IC will simultaneously operate with phase and The above description is intended by way of example only.

What is claimed is:

1. A radio integrated circuit (IC) comprising:
   at least one transmitter configured to transmit a signal;
   at least one receiver configured to receive a signal;
   a local oscillator signal source configured to generate a local oscillator signal for use in radio transmission or radio reception; and
   a port circuit configured to couple the local oscillator signal to another radio IC for use by the other radio IC in radio transmission or radio reception.

2. The radio IC of claim 1, wherein the local oscillator signal generated is a radio frequency (RF) local oscillator signal.

3. The radio IC of claim 1, wherein both radio ICs use the local oscillator signal corresponding to a same frequency.

4. The radio IC of claim 1 further comprising a package pin configured to electrically connect the port circuit to the other radio IC.

5. The radio IC of claim 4, wherein the port circuit is a bi-directional port circuit.

6. The radio IC of claim 4, wherein the package pin is used to couple the local oscillator signal to the other radio IC.

7. A radio integrated circuit (IC) comprising:
   at least one transmitter configured to transmit a signal;
   at least one receiver configured to receive a signal; and
   a port circuit configured to receive a local oscillator signal from another radio IC for use in radio transmission or radio reception.

8. The radio IC of claim 7, wherein the local oscillator signal received is a radio frequency (RF) local oscillator signal.

9. The radio IC of claim 7, wherein both radio ICs use the local oscillator signal corresponding to a same frequency.

10. The radio IC of claim 7 further comprising a package pin configured to electrically connect the port circuit to the other radio IC.

11. The radio IC of claim 10, wherein the port circuit is a bi-directional port circuit.

12. The radio IC of claim 10, wherein the package pin is used to couple the local oscillator signal to the other radio IC.

13. A radio communication device comprising:
   a first radio integrated circuit (IC) configured to perform one or both of radio transmission or radio reception; and
   a second radio IC configured to perform one or both of radio transmission or radio reception;
   wherein the first radio IC is configured to generate and use a local oscillator signal for radio transmission or radio reception operation, and wherein the local oscillator signal is coupled to the second radio IC for use in radio transmission or radio reception operation by the second radio IC, and wherein the first and second radio ICs each comprises a bi-directional port circuit, the bi-directional port circuit in the first radio IC is configured to couple the local oscillator signal to the bi-directional port circuit of the second radio IC, and the bi-directional port circuit in the second radio IC is configured to couple the local oscillator signal from the first radio IC for use in radio transmission or radio reception by the second radio IC.

14. The radio communication device of claim 13, wherein the local oscillator signal generated by the first radio IC is a radio frequency (RF) local oscillator signal.

15. The radio communication device of claim 14, wherein the second radio IC uses the RF local oscillator signal from the first radio IC for transmission or reception at a frequency corresponding to the frequency of the RF local oscillator signal.

16. The radio communication device of claim 15, wherein the first and second radio ICs each use the RF local oscillator signal for simultaneously transmitting signals at the same radio frequency corresponding to the frequency of the RF local oscillator signal.

17. The radio communication device of claim 15, wherein the first and second radio ICs each use the RF local oscillator signal for simultaneously receiving signals at the same radio frequency corresponding to the frequency of the RF local oscillator signal.

18. The radio communication device of claim 15, wherein the first and second radio ICs each comprises a plurality of transmitters, and wherein the first radio IC supplies the RF local oscillator signal to each of plurality of transmitters of the first radio IC and the second radio IC supplies the RF local oscillator signal coupled from the first radio IC to each of the plurality of transmitters of the second radio IC so that the plurality of transmitters of the first radio IC and the plurality of transmitters of the second radio IC simultaneously transmit a combined plurality of signals at a radio frequency corresponding to the frequency of the RF local oscillator signal.

19. The radio communication device of claim 15, wherein the first and second radio ICs each comprises a plurality of receivers, and wherein the first radio IC supplies the RF local oscillator signal to each of the plurality of receivers of the first radio IC and the second radio IC supplies the RF local oscillator signal coupled from the first radio IC to each of the plurality of receivers of the second radio IC so that the plurality of receivers of the first radio IC and the plurality of receivers of the second radio IC simultaneously receive a combined plurality of signals at a radio frequency corresponding to the frequency of the RF local oscillator signal.

20. The radio communication device of claim 13, wherein the bi-directional port circuit in each radio IC either (1) couples the local oscillator signal to the port circuit in the other radio IC or (2) couples the local oscillator signal generated by the other radio IC for use by in radio transmission or radio reception.

21. The radio communication device of claim 20, wherein each radio IC comprises a package pin electrically connected to the port circuit, and further comprising an electrical connection between the package pin of the first radio IC and the package pin of the second radio IC.

22. The radio communication device of claim 21, wherein the package pin associated with the port circuit in each radio IC is used for coupling a local oscillator signal to or from the other radio IC.

* * * * *